United States Patent
Lee et al.

(10) Patent No.: US 7,615,842 B2
(45) Date of Patent: Nov. 10, 2009

(54) INDUCTOR INTEGRATED CHIP

(75) Inventors: Joo-ho Lee, Seoul (KR); Hae-seok Park, Yongin-si (KR); Byeoung-ju Ha, Seongnam-si (KR); Seog-woo Hong, Yongin-si (KR); Hyung Choi, Seongnam-si (KR); In-sang Song, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 265 days.

(21) Appl. No.: 11/473,079

(22) Filed: Jun. 23, 2006

(65) Prior Publication Data

US 2007/0138594 A1    Jun. 21, 2007

(30) Foreign Application Priority Data

Dec. 20, 2005    (KR) .................. 10-2005-0126049

(51) Int. Cl.
*H01L 29/00* (2006.01)

(52) U.S. Cl. .................. 257/531; 257/704; 257/713; 257/659; 257/660; 257/698; 257/778; 257/780; 257/738; 257/685; 257/678; 257/710; 257/707; 257/E23.001; 257/E23.004; 438/121; 438/125; 438/124; 438/126

(58) Field of Classification Search .......... 257/704, 257/531, 713, 659, 660, 698, 778, 780, 738, 257/685, 678, 710, 707, E23.001, E23.004; 438/121, 125, 124, 126

See application file for complete search history.

(56) References Cited

U.S. PATENT DOCUMENTS

| | | | | | |
|---|---|---|---|---|---|
| 6,028,354 | A | * | 2/2000 | Hoffman | 257/706 |
| 6,630,725 | B1 | * | 10/2003 | Kuo et al. | 257/659 |
| 6,673,697 | B2 | * | 1/2004 | Ma et al. | 438/455 |
| 6,710,681 | B2 | * | 3/2004 | Figueredo et al. | 333/187 |

* cited by examiner

*Primary Examiner*—Kiesha L Rose
*Assistant Examiner*—Tucker Wright
(74) *Attorney, Agent, or Firm*—Sughrue Mion, PLLC

(57) ABSTRACT

An inductor integrated chip and fabrication method thereof is provided. The inductor integrated chip includes a wafer; an inductor bonded on a surface of the wafer; a circuit element formed on the surface of the wafer and coupled to a first end of the inductor; a packaging wafer connected to the surface of the wafer and packaging the inductor and the circuit element; and a connecting electrode formed on the packaging wafer and connected to a second end of the inductor. The method includes forming an inductor and a circuit element on a surface of a wafer, wherein the circuit element is coupled to a first end of the inductor; forming a connecting electrode on a packaging wafer; and packaging the inductor and the circuit element by joining the wafer and the packaging wafer so as to connect the connecting electrode with a second end of the inductor.

6 Claims, 7 Drawing Sheets

INDUCTOR INTEGRATED CHIP

CROSS-REFERENCE TO RELATED APPLICATIONS

This application claims priority from Korean Patent Application No. 10-2005-0126049, filed Dec. 20, 2005 in the Korean Intellectual Property Office, the entire contents of which are incorporated herein by reference.

BACKGROUND OF THE INVENTION

1. Field of the Invention

Apparatuses and methods consistent with the present invention relate to an inductor integrated chip and a fabrication method thereof so as to be electrically connected to an inductor through a connecting electrode formed on a packaging wafer.

2. Description of the Related Art

Circuit chips for multiple functions have been developing according to development of electronic technologies. There are chips requiring an inductor such as a filter and duplexer. The chips requiring the inductor are fabricated in a small inductor integrated chip form in which the inductor and various circuit elements are integrated on a wafer.

In such chips, an inductor is generally fabricated in a spiral or meander shape. In the case of a spiral inductor, one end of the spiral inductor is located within the spiral structure and the other end of the spiral inductor is located out of the spiral structure. The one end is connected to an external power source and the other end is connected to another circuit element in the inductor integrated chip. In the case of a meander inductor, one end of the meander inductor is connected to an external power source and the other end is connected to another circuit element in the inductor integrated chip.

In a conventional inductor integrated chip, one end of an inductor is connected to an external power source using a metal film formed on a wafer. That is, the metal film is bonded on the wafer, an insulation layer is bonded on the metal film, and a part of the insulation layer is etched so that a part of the metal film is exposed. Next, the inductor is formed on the insulation layer and the one end of the inductor is connected to the exposed part of the metal film. Thus, the metal film is connected to the external power source to provide an electric current into the inductor.

In the above-described conventional inductor integrated chip, since power is supplied to the inductor along the surface of the wafer, the resistance value becomes high. The Q value of an inductor is in inverse proportion to the resistance value so that the high resistance value reduces the Q value of the inductor. Additionally, the parasitic capacitance of the metal film and wafer affects the performance of the inductor integrated chip. Therefore, the performance of the inductor integrated chip decreases.

Furthermore, the metal film and insulation layer have to be additionally formed under the inductor so that the fabrication process of the inductor integrated chip becomes complicated and the size of the inductor integrated chip becomes bigger.

SUMMARY OF THE INVENTION

An aspect of the present invention is to address the above and other problems. Accordingly, an aspect of the present invention is to provide an inductor integrated chip to prevent parasitic capacitance and resistance from lowering the performance of the inductor integrated chip by being electrically connected to an inductor through a connecting electrode formed on a packaging wafer.

Another aspect of the present invention is to provide a fabrication method of an inductor integrated chip to simplify the fabrication process of the inductor integrated chip for fabrication efficiency and fabricate a small-sized inductor integrated chip.

In order to achieve the above-described and other aspects of the present invention, there is provided an inductor integrated chip, comprising a wafer, an inductor bonded on a surface of the wafer, a circuit element formed on the surface of the wafer and coupled to a first end of the inductor, a packaging wafer connected to the surface of the wafer and packaging the inductor and the circuit element, and a connecting electrode formed on the packaging wafer and coupled to a second end of the inductor.

The connecting electrode may comprise a surface connecting electrode formed on a lower surface of the packaging wafer and coupled to the second end of the inductor, and a penetrating connecting electrode penetrating the package wafer and coupled to the surface connecting electrode.

The penetrating connecting electrode may vertically penetrate through the package wafer.

The inductor may be formed on the surface of the wafer in a spiral form, an outer end of the inductor may be coupled to the circuit element, and an inner end of the inductor may be coupled to the surface connecting electrode.

The inductor may be formed on the surface of the wafer in a meander form, an one end of the inductor may be coupled to the circuit element, and the second end of the inductor may be coupled to the surface connecting electrode.

The inductor integrated chip may further comprise an insulation layer bonded on the surface of the wafer and insulating the circuit element and the inductor from the wafer.

The circuit element may be a film bulk acoustic resonator (FBAR), the FBAR comprising a lower electrode bonded on the insulation layer, a piezoelectric layer bonded on the lower electrode, an upper electrode bonded on the piezoelectric layer, and an air gap formed between a part of the lower electrode and the insulation layer to isolate the lower electrode from the insulation layer.

According to an embodiment of the present invention, a method of fabricating an inductor integrated chip comprises (a) forming an inductor and a circuit element on a surface of a wafer, wherein the circuit element is coupled to a first end of the inductor, (b) forming a connecting electrode on a packaging wafer, and (c) packaging the inductor and the circuit element by joining the wafer and the packaging wafer so as to couple the connecting electrode to the second end of the inductor.

In the step (a), the inductor may be formed on the surface of the wafer in a spiral form, and an outer end of the inductor may be coupled to the circuit element.

In the step (c), the wafer and the packaging wafer may be joined so as to couple the connecting electrode to an inner end of the inductor.

In the step (a), the inductor may be formed on the surface of the wafer in a meander form, and a first end of the inductor may be coupled to the circuit element.

In the step (c), the wafer and the packaging wafer may be joined so as to couple the connecting electrode to a second end of the inductor.

The step (b) may comprise forming a cavity by etching surface of the packaging wafer, forming a surface connecting electrode by forming a metal film on an area of the cavity and the surface of the packaging wafer, forming a via hole which penetrates the packaging wafer, and forming a penetrating connecting electrode which couples an end of the packaging wafer with the surface connecting electrode by filling the via hole with a conductive material.

The via hole may vertically penetrate through the packaging wafer.

The circuit element may be implemented with at least one FBAR.

The step (a) may comprise bonding an insulation layer on the surface of the wafer, bonding a sacrificial layer on a predetermined area of the insulation layer, bonding a first metal film on the surface of the wafer which includes the sacrificial layer so as to form a lower electrode, a lower pattern of the inductor and a lower pattern of a bonding layer by patterning, sequentially forming a piezoelectric layer and a upper electrode on the lower electrode, forming an upper pattern of the inductor and an upper pattern of the bonding layer by bonding a second metal film on the lower pattern of the inductor and the lower pattern of the bonding layer, and forming an air gap by removing the sacrificial layer.

The step (a) may comprise bonding an insulation layer on the surface of the wafer, bonding a sacrificial layer on an area of the insulation layer, bonding a lower electrode on the surface of the wafer which includes the sacrificial layer, bonding a piezoelectric layer on the lower electrode, bonding a first metal film on the insulation layer and the piezoelectric layer, and forming an upper electrode on the piezoelectric layer, a lower pattern of the inductor and a lower pattern of a bonding layer by patterning, forming an upper pattern of the inductor and an upper pattern of the bonding layer by bonding a second metal film on the lower pattern of the inductor and the lower pattern of the bonding layer, and forming an air gap by removing the sacrificial layer.

BRIEF DESCRIPTION OF THE DRAWING FIGURES

The above and other aspects of the present invention will become more apparent by describing in detail exemplary embodiments thereof with reference to the attached drawing figures, wherein.

DETAILED DESCRIPTION OF EXEMPLARY EMBODIMENTS OF THE PRESENT INVENTION

Hereinafter, exemplary embodiments of the present invention will be described in detail with reference to the accompanying drawing figures.

Figure 1:
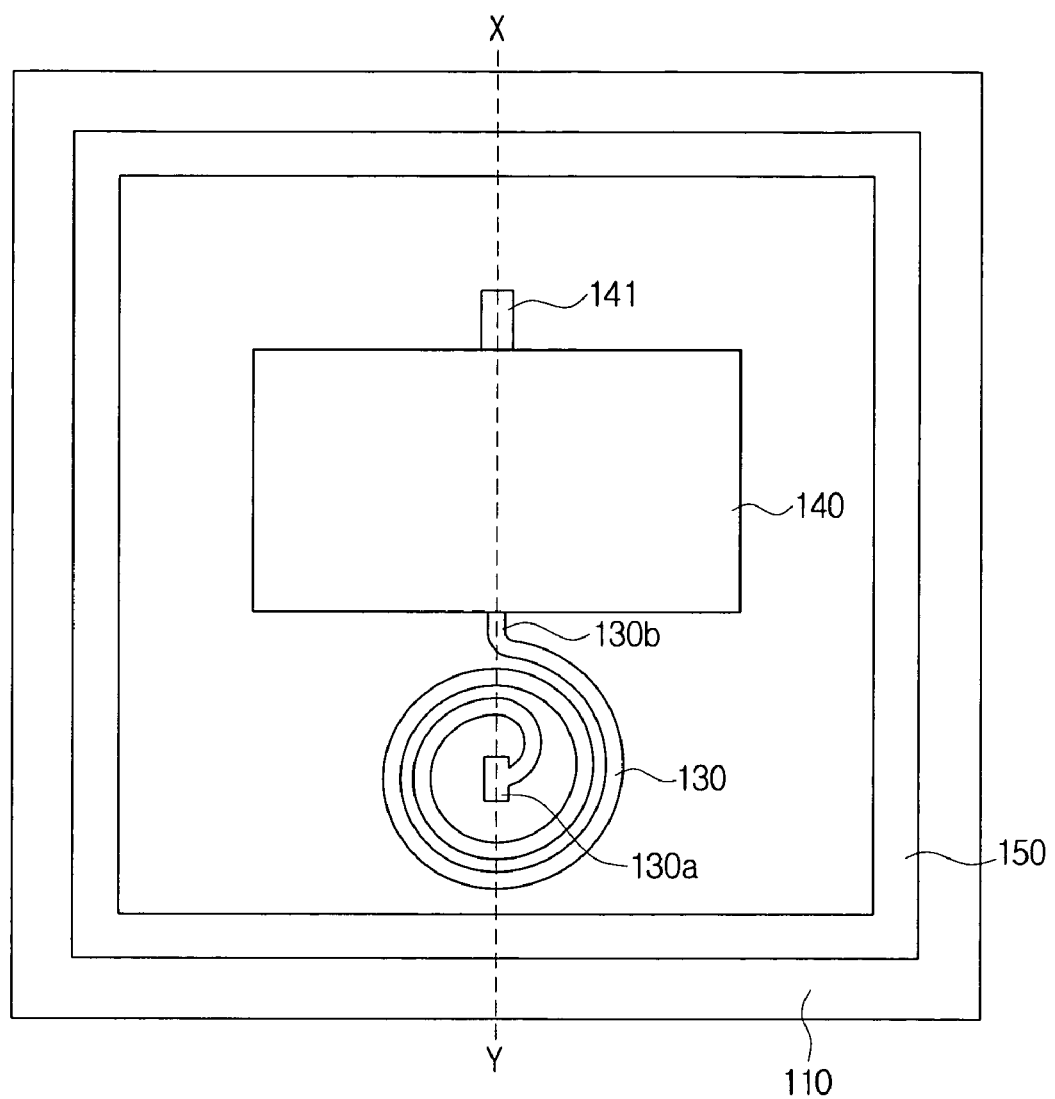
FIG. 1 is a plane view showing the configuration of an inductor integrated chip according to a first exemplary embodiment of the present invention.

FIG. 1 is a plane view showing the configuration of an inductor integrated chip according to a first exemplary embodiment of the present invention. According to FIG. 1, the inductor integrated chip includes a wafer 110, a bonding layer 150, an inductor 130 and a circuit element 140.

The bonding layer 150 is connected to a packaging wafer (not shown). Plural connecting electrodes (not shown) are formed on the packaging wafer.

The inductor 130 is fabricated on the wafer 110 in a certain form, which may be predetermined. FIG. 1 shows the spiral-shaped inductor 130. In the case of the spiral-shaped inductor, an inner end 130a of the inductor is electrically connected to one of the connecting electrodes on the packaging wafer. An outer end 130b of the inductor is electrically connected to the circuit element 140.

The circuit element 140 can be implemented in many ways such as a film bulk acoustic resonator (FBAR), filter, or capacitor, or other similar circuit implementation known in the art.

The circuit element 140 can have at least one input/output terminal. As shown in FIG. 1, the circuit element 140 has a terminal 141 on the opposite side of the side connected to the outer end 130b of the inductor 130. Accordingly, if the inner end 130a of the inductor 130 is connected with a ground power source and the terminal 141 of the circuit element 140 is connected to a signal power source, an inductor integrated chip having the inductor 130 and the circuit element 140 serially connected with each other can be implemented.

Figure 2:
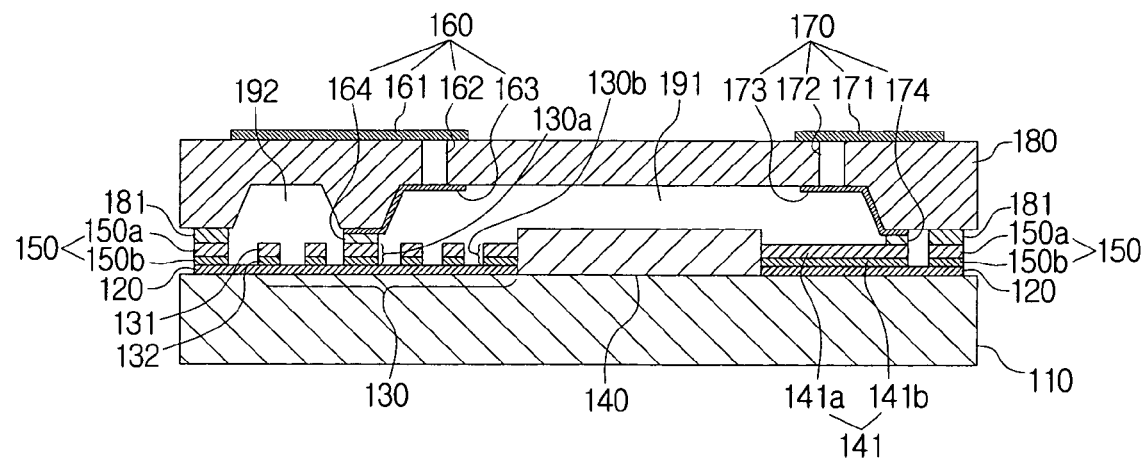
FIG. 2 is a cross sectional view vertically showing the inductor integrated chip of FIG. 1 which is cut along line X-Y.

FIG. 2 is a cross sectional view vertically showing the inductor integrated chip of FIG. 1 which is cut along line X-Y for more detailed description.

Referring to FIG. 2, the inductor integrated chip includes the wafer 110, an insulation layer 120, the bonding layer 150, the inductor 130, the circuit element 140, a packaging wafer 180, and first and second connecting electrodes 160 and 170.

One surface of the packaging wafer 180 is partly etched so that first and second cavities 191 and 192 are formed. Accordingly, in order for the circuit element 140 to be located in the first cavity 191, the surface of the packaging wafer 180 having the cavities 191 and 192 formed therein is connected to the surface of the wafer 110 with the circuit element 140 facing the cavity 191.

The insulation layer 120 is bonded on the surface of the wafer 110 to insulate the inductor 130 and the circuit element 140 from the wafer 110.

The bonding layer 150, comprises an upper pattern 150a and a lower pattern 150b. Additionally, the inductor 130 comprises an upper pattern 131 and a lower pattern 132. The lower pattern 150b of the bonding layer 150 and the lower pattern 132 of the inductor 130 can be fabricated in the same process at the same time. Alternatively, the lower patterns may be fabricated at different times and/or by different processes. The upper pattern 150a of the bonding layer 150 and the upper pattern 131 of the inductor 130 can be fabricated in the same process at the same time, as well. Alternatively, the upper patterns may be fabricated at different times and/or by different processes. Each lower pattern 150b and 132 can be implemented with a general metal film, and each upper pattern 150a and 131 can be implemented with a conductive material film such as gold, or other conductive film material known in the art.

The inner end 130a of the inductor 130 is connected to the first connecting electrode 160 on the packaging wafer 180.

The first connecting electrode 160 includes a first penetrating connecting electrode 162 for vertically penetrating the packaging wafer 180, a first surface connecting electrode 163, a first outside connecting pad 161 and a first inside connecting pad 164. The inner end 130a of the inductor 130 directly contacts with the first inside connecting pad 164 so as to be connected to the first connecting electrode 160. Thus, if the first outside connecting pad 161 is connected to an external power source (not shown), the inductor 130 can receive power through the first connecting electrode 160.

The outer end 130b of the inductor 130 is connected to the circuit element 140. In addition, a terminal 141 of the circuit element 140 is connected to the second connecting electrode 170 on the packaging wafer 180. The terminal 141 of the circuit element 140 comprises an upper pattern 141a and a lower pattern 141b, and can be fabricated at the same time with the upper patterns 150a and 131 and the lower patterns 150b and 132 of the bonding layer 150 and the inductor 130. Alternatively, the upper pattern 141a and the lower pattern 141b may be fabricated at different times.

The second connecting electrode 170 includes a second penetrating connecting electrode 172 for vertically penetrating the packaging wafer 180, a second surface connecting electrode 173, a second outside connecting pad 171 and a second inside connecting pad 174. Accordingly, the circuit element 140 can also be connected to an external power source (not shown) through the second connecting electrode 170. The first and second inside connecting pads 164 and 174 can be formed on protrusions which form boundaries of the cavities 191 and 192 on the packaging wafer 180. As FIG. 2 is a cross sectional view, the first and second cavity 191 and 192 are separated for easy explanation. However, alternatively one cavity including the rest of the packaging wafer 180 except for the area corresponding to the inner end 130a of the inductor 130 and the edge area can be fabricated.

The bonding layer 150 is bonded with a bonding pad 181 on the packaging wafer 180 to connect the packaging wafer 180 and the wafer 110.

Figure 3:
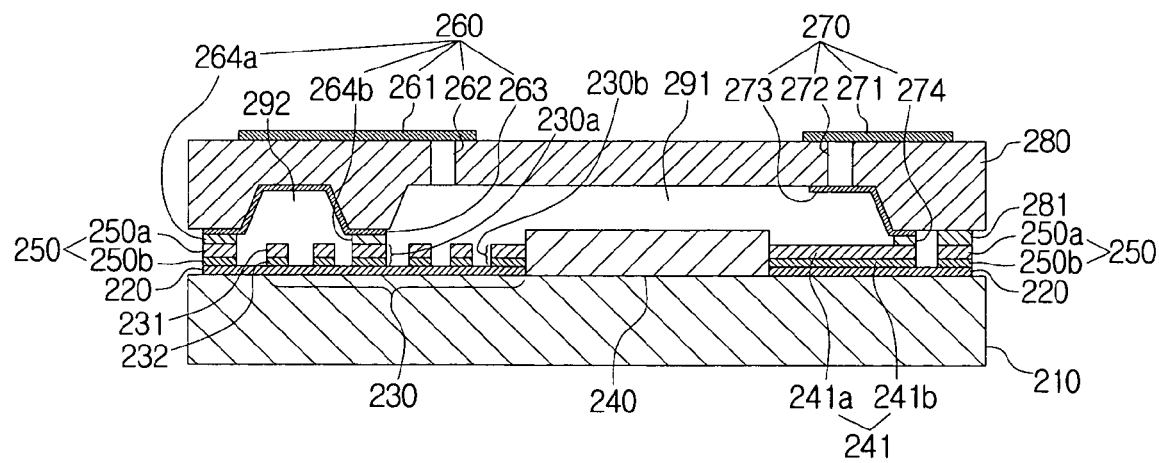
FIGS. 3 and 4 are cross sectional views vertically showing the configurations of an inductor integrated chip according to a second and a third exemplary embodiment of the present invention, respectively.

FIG. 3 is a cross sectional view vertically showing the configuration of an inductor integrated chip according to a second embodiment of the present invention. As shown in FIG. 3, the inductor integrated chip includes a wafer 210, an insulation layer 220, an inductor 230, a circuit element 240, a bonding layer 250, a packaging wafer 280, and first and second connecting electrodes 260 and 270. Cavities 291 and 292 are formed between the packaging wafer 280 and the wafer 210. The packaging wafer 280 and the wafer 210 are bonded with each other through the bonding layer 250.

Referring to FIG. 3, the first connecting electrode 260 includes a first outside connecting pad 261, a first penetrating connecting electrode 262, a first surface connecting electrode 263, a first inside connecting pad 264b and a first bonding pad 264a. The first bonding pad 264a is bonded with the bonding layer 250. The first surface connecting electrode 263 is connected to both the first inside connecting pad 264b and the first bonding pad 264a. Additionally, unlike in the first exemplary embodiment of FIG. 2, the first connecting electrode 260 is formed on the second cavity 292, not on the first cavity 291 where the circuit element 240 is located. Thus, the first and second connecting electrodes 260 and 270 can be adjustably located according to a design objective.

The second connecting electrode 270 includes a second outside connecting pad 271, a second penetrating connecting electrode 272, a second surface connecting electrode 273, and a second inside connecting pad 274. In addition, an inner end 230a of the inductor 230 is connected to the first connecting electrode 260, and the terminal 241 of the circuit element 240 is connected to the second connecting electrode 270. A second bonding pad 281 is formed on the surface of the packaging wafer 280. The second bonding pad 281 can be fabricated in the same process as the first bonding pad 264a. Alternatively, the bonding pads may be fabricated in different processes.

The bonding layer 250, the inductor 230 and the terminal 241 of the circuit element 240, respectively comprises upper and lower patterns 250a, 250b, 231, 232, 241a and 241b. As this structure is the same as that of the first exemplary embodiment shown in FIG. 2, further description will be omitted.

Figure 4:
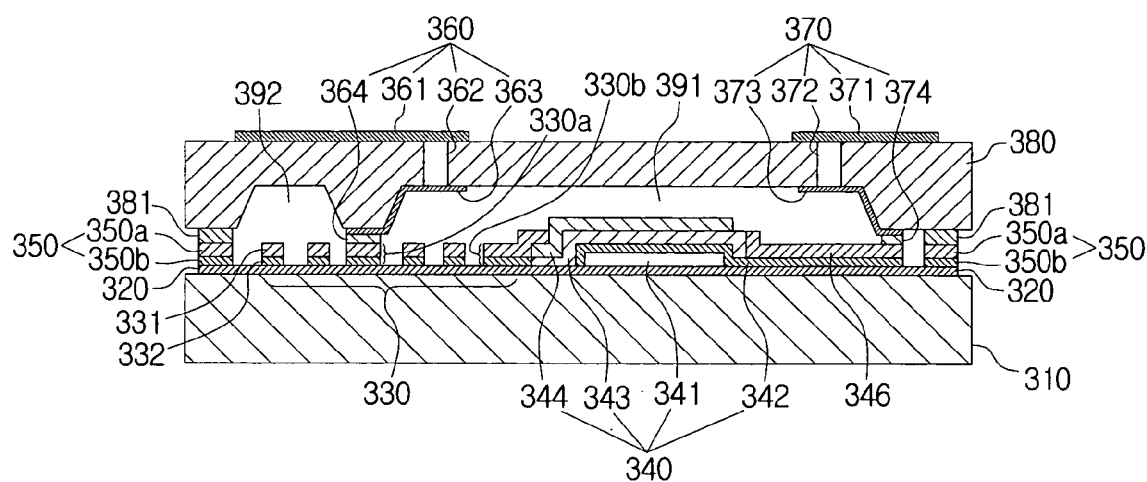

FIG. 4 is a cross sectional view vertically showing the configuration of an inductor integrated chip according to a third embodiment of the present invention. FIG. 4 shows the configuration of an inductor integrated chip having an inductor and a FBAR 340. In FIGS. 1 to 3, the circuit elements 140 and 240 respectively can be also be implemented with at least one FBAR.

Referring to FIG. 4, an insulation layer 320, a lower pattern 332 of an inductor 330, a lower pattern 350b of a bonding layer 350 and a lower electrode 342 are bonded on a wafer 310. The lower electrode 342 is formed with a part distanced from the insulation layer 320. The distanced part forms an air gap 341.

A piezoelectric layer 343 and an upper electrode 344 are sequentially bonded on the lower electrode 342. Therefore, the air gap 341, the lower electrode 342, the piezoelectric layer 343, and the upper electrode 344 form an air gap type FBAR.

An upper pattern 331 of the inductor 330 is bonded on the lower pattern 332 of the inductor 330 to form the inductor 330. A part of the upper pattern 331 is connected to the upper electrode 344. Accordingly, the inductor 330 and the FBAR 340 are serially connected to each other. A connecting pad 346 is bonded on the lower electrode 342. The connecting pad 346 is connected to a second inside connecting pad 374 of a second connecting electrode 370.

In FIG. 4, it is structurally illustrated that the upper electrode 344 is connected to the inductor 330, but the lower electrode 342 can be fabricated to be connected to the inductor 330 by adjusting the location of the lower electrode 342. In that case, the lower pattern 332 of the inductor 330 and the lower electrode 342 can be implemented to be integrally formed.

An upper pattern 350a of the bonding layer 350 is bonded on the lower pattern 350b of the bonding layer 350 to form the bonding layer 350. The bonding layer 350 is bonded with a bonding pad 381 on a packaging wafer 380.

A first connecting electrode 260 and a second connecting electrode 370 are formed on the packaging wafer 380. The first and second connecting electrodes 360 and 370 include outside connecting pads 361 and 371, penetrating connecting electrodes 362 and 372, surface connecting electrodes 363 and 373, and inside connecting pads 364 and 374, respectively. As the structure of the first and second connecting electrodes 360 and 370 is the same as that of the first exemplary embodiment shown in FIG. 2, further description will be omitted.

The inductor 330 can be fabricated in a spiral or meander form. FIG. 4 shows the configuration of an inductor integrated chip in the case of a spiral-shaped inductor. The configuration of an inductor integrated chip with a meander-shaped inductor will be described later.

Furthermore, although not shown in FIG. 4, the inductor 330 can be integrated with a filter having plural FBARs. In that case, the plural FBARs are added on the wafer 310 in FIG. 4 and plural connecting electrodes are also added on the packaging wafer 380. Such configuration can be inferred from the configuration of FIG. 4 so that illustration will be omitted.

Figure 5A:
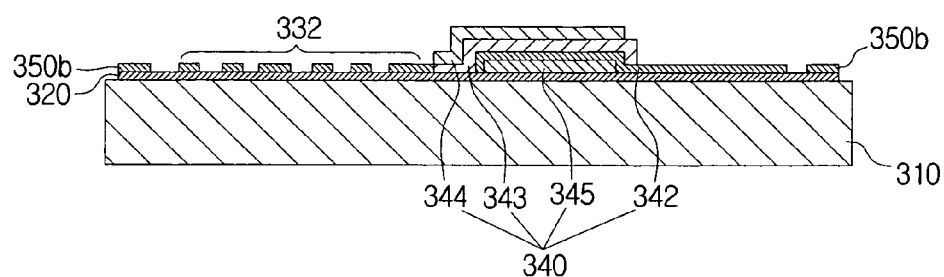
FIGS. 5A and 5B are cross sectional views vertically showing the process of integrating an inductor and a circuit element on a wafer to fabricate the inductor integrated chip of FIG. 4.
Figure 5B:
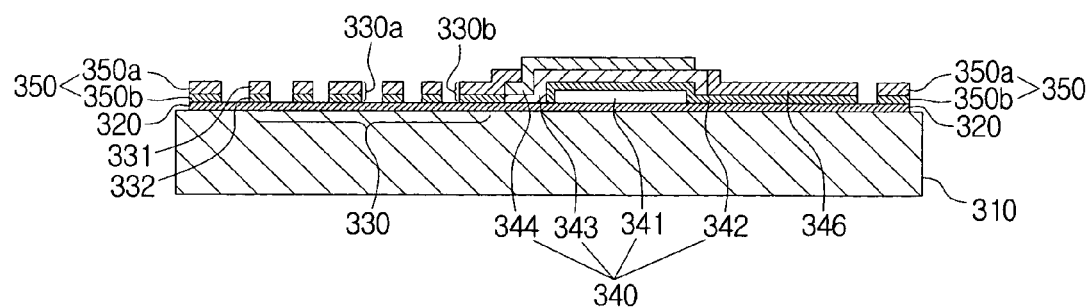

FIGS. 5A and 5B are cross sectional views vertically showing the process of integrating the inductor and the circuit element on the wafer to fabricate the inductor integrated chip of FIG. 4. FIGS. 5A and 5B show the process in an embodiment forming the lower pattern 332 of the inductor 330, the lower pattern 350b of the bonding layer 350 and the lower electrode 342 at the same time.

First, referring to FIG. 5A, the insulation layer 320 is bonded on the wafer 310. The insulation layer 320 functions as an etching stopper in etching a sacrificial layer to be described later, and also insulates the inductor 330 and the FBAR 340 from the wafer 310.

The sacrifice layer 345 is bonded on a certain area, which may be predetermined, of the insulation layer 320. A first metal film is entirely bonded on the insulation layer 320 and the sacrificial layer 345, and then the lower pattern 332 of the inductor 330, the lower pattern 350b of the bonding layer 350 and the lower electrode 342 are formed by patterning in a certain form, which may be predetermined. The piezoelectric layer 343 and the upper electrode 344 are sequentially bonded on the lower electrode 342 so that a resonance structure is formed.

In this case, a piezoelectric material is entirely bonded on the insulation layer 320 and the lower electrode 342, and the piezoelectric layer 343 is formed by patterning. A conductive material is entirely bonded on the insulation layer 320 and the piezoelectric layer 343, and the upper electrode 344 is formed by patterning.

In an embodiment forming the inductor 330 and the bonding layer 350 with the upper electrode 344 at the same time, the upper electrode 344, the lower pattern 332 of the inductor 330 and the lower pattern 350b of the bonding layer 350 can be fabricated at the same time by leaving a conductive material of the area corresponding to the inductor 330 and the bonding layer 350 when forming the upper electrode 344.

Referring to FIG. 5B, the upper pattern 350a of the bonding layer 350 and the upper pattern 331 of the inductor 330 are fabricated. The upper pattern 331 of the inductor 330 is electrically connected to the upper electrode 344. In this state, the air gap 341 is formed by removing the sacrificial layer 345. In detail, a via hole (not shown) is formed to be connected to the sacrificial layer 345, and an etching material is injected through the via hole to etch the sacrificial layer 345, so that the air gap 341 is formed. Accordingly, the FBAR 340 including the air gap 341, the lower electrode 342, and the piezoelectric layer 343 and the upper electrode 344 is formed.

If the wafer 310 of FIG. 5B is connected to the packaging wafer 380, and the first and second connecting electrodes 360 and 370 on the packaging wafer 380 are connected to the inductor 330 and the FBAR 340, respectively, the inductor integrated chip of FIG. 4 is fabricated.

Figure 6A:
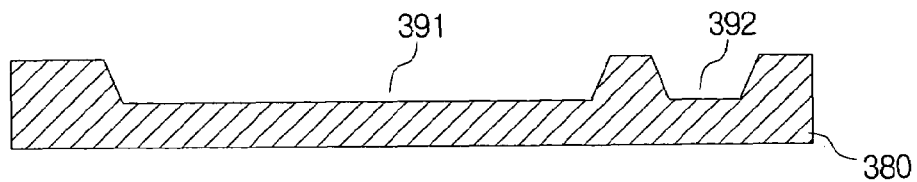
FIGS. 6A to 6C are cross sectional views vertically showing the process of fabricating a packaging wafer to package the inductor integrated chip of FIG. 4.
Figure 6B:
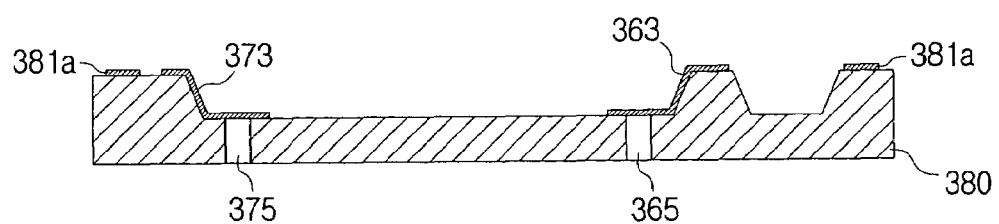
Figure 6C:
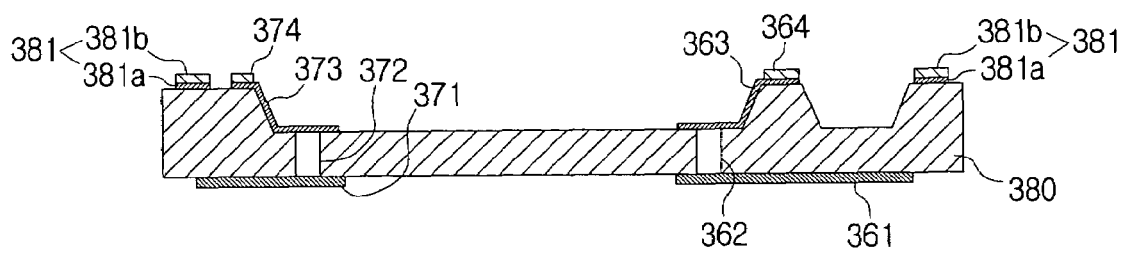

FIGS. 6A to 6C are cross sectional views vertically showing a method of fabricating a packaging wafer. Referring to FIG. 6A, first, one surface of the packaging wafer 380 is etched to form cavities 391 and 392. The depth and size of the cavities 391 and 392 are adjusted according to the height and size of a circuit element on the wafer 310, that is, the FBAR 340 or other circuit element which is to be included on the wafer 310.

As in FIG. 6B, a conductive material is bonded on the surface of the packaging wafer 380 where the cavities 391 and 392 are formed, and the first and second surface connecting electrodes 363 and 373 and a lower pattern 381a of the bonding pad 381 are formed by patterning. Subsequently, via holes 375 and 365 are formed which will be connected to the first and second surface connecting electrodes 363 and 373.

Referring to FIG. 6C, the inside of each of the via holes 375 and 365 is filled with a conductive material to form the first and second penetrating connecting electrodes 362 and 372. The first and second outside connecting pads 361 and 371 are bonded on the other surface of the packaging wafer 380. The first and second inside connecting pads 364 and 374 are bonded on the first and second surface connecting electrodes 363 and 373, and an upper pattern 381b of the bonding pad 381 is bonded on the lower pattern 381a of the bonding pad 381 to form the bonding pad 381. If the upper part of the packaging wafer 380 of FIG. 6C is connected to the upper part of the wafer 310 of FIG. 5B, the inductor integrated chip of FIG. 4 is formed.

It should be noted that the exemplary embodiments shown in FIGS. 1 to 3 can also be fabricated using the process shown in FIGS. 5A and 5B and FIGS. 6A to 6C. That is, the inductor and the circuit element are formed on a surface of the wafer, the packaging wafer is separately formed using the process shown in FIGS. 6A to 6C, and then the wafer and the packaging wafer are connected to each other. The connecting electrodes on the packaging wafer are fitted to the inductor and the terminal of the circuit element. Accordingly, many kinds of inductor integrated chip can be fabricated.

Figure 7:
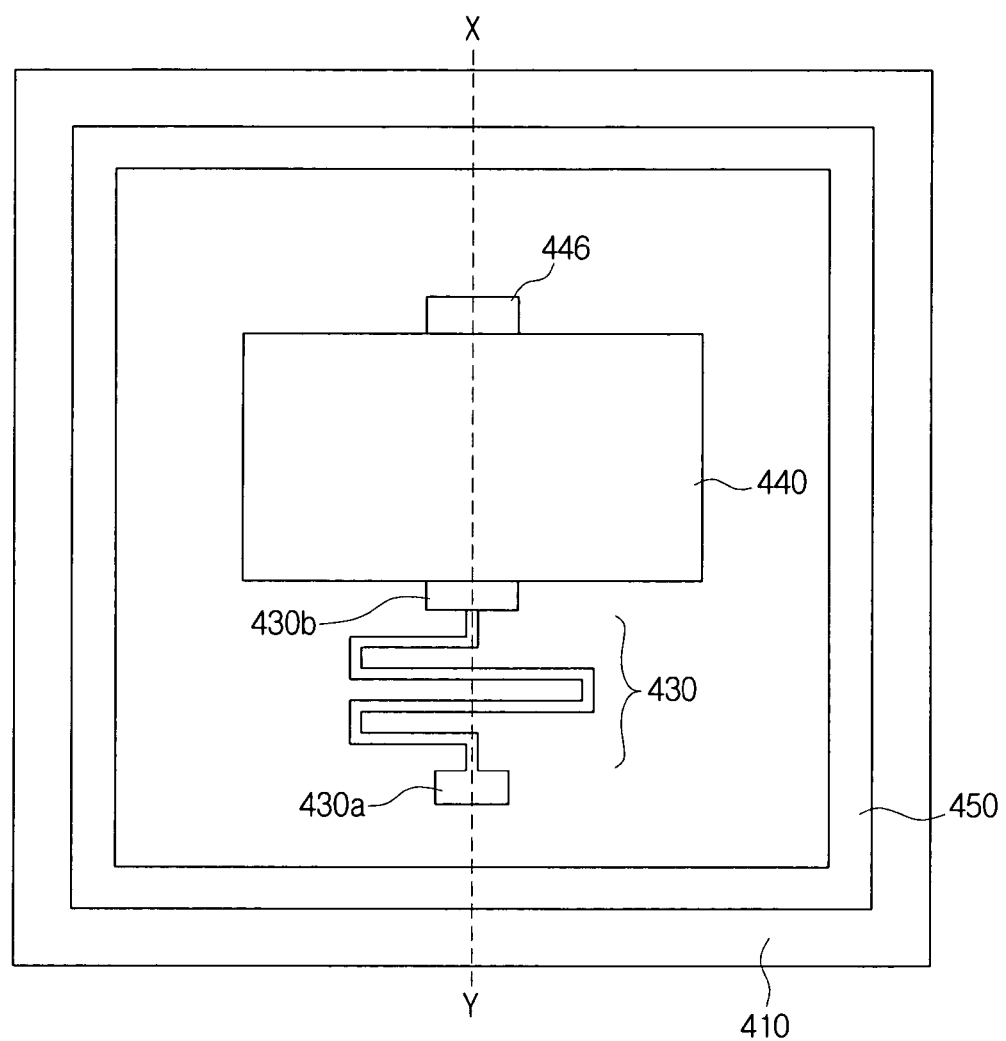
FIG. 7 is a plane view showing the configuration of an inductor integrated chip with a meander-shaped inductor according to a fourth exemplary embodiment of the present invention.

FIG. 7 is a plane view showing the configuration of an inductor integrated chip with a meander-shaped inductor. Referring to FIG. 7, the inductor integrated chip includes a wafer 410, a bonding layer 450, an inductor 430 and a circuit element 440.

The inductor 430 is fabricated in a meander form. One end 430a of the meander inductor is connected to a connecting electrode on a packaging wafer (not shown). The other end 430b of the meander inductor is connected to the circuit element 440. A terminal 446 of the circuit element 440 is also connected to another connecting electrode on the packaging wafer. Accordingly, the circuit element 440 and the inductor 430 are serially connected to each other and electrically connected to an external power source.

Figure 8:
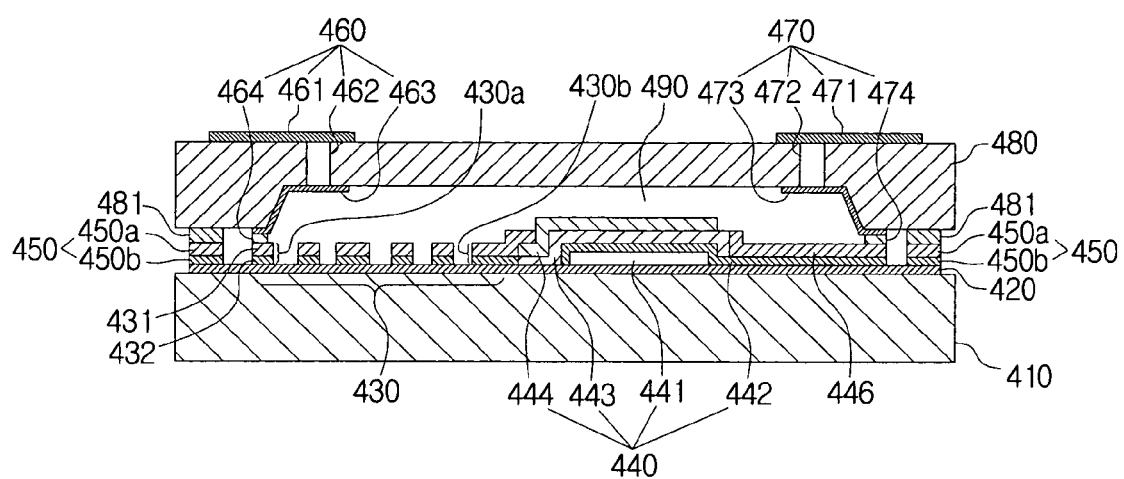
FIG. 8 is a cross sectional view vertically showing the configuration of the inductor integrated chip of FIG. 7.

FIG. 8 is a cross sectional view vertically showing the inductor integrated chip of FIG. 7 which is cut along line X-Y. Referring to FIG. 8, a first connecting electrode 460 and a second connecting electrode 470 are formed on a packaging wafer 480. The first and second connecting electrodes 460 and 470 include second outside connecting pads 461 and 471, penetrating connecting electrodes 462 and 472, surface connecting electrodes 463 and 473, and inside connecting pads 464 and 474, respectively.

A cavity 490 is formed on a surface of the packaging wafer 480. Unlike in FIGS. 2 to 4, when the inductor 430 is meander-shaped, both ends 430a and 430b of the inductor 430 are located out of the inductor 430 so that a protruding part is not needed in the middle part of the cavity 490. Therefore, the inductor 430 and the FBAR 440 can be integrated together in one cavity 490. First and second surface connecting electrodes 463 and 473 are bonded on the side surfaces of the cavity 490, respectively. First and second inside connecting pads 464 and 474 are bonded on the first and second surface connecting electrodes 463 and 473, respectively. The first inside connecting pad 464 is connected to the one end 430a of the inductor 430, and the second inside connecting pad 474 is connected to a connecting pad 446 on a lower electrode. Additionally, the other end 430b of the inductor 430 is connected to an upper electrode 444. The inductor 430 comprises upper and lower patterns 431 and 432.

The bonding layer 450 comprises upper and lower patterns 450a and 450b, and is connected to a bonding pad 481. The FBAR includes an air gap 441, a lower electrode 442, a piezoelectric layer 443 and an upper electrode 444. As such structure is the same as that of FIG. 4, further description will be omitted.

In the exemplary embodiments of FIGS. 2 to 4 and 8, the bonding layer and the inductor are illustrated to have upper and lower patterns, respectively; however, the bonding layer and the inductor can be implemented in one pattern. In addition, in the exemplary embodiments of FIGS. 4 and 8, if the air gap is formed by bulk-etching the wafer, the air gap can be located within the wafer, not on the wafer. In that case, the lower electrode can be implemented in a plate form.

As can be appreciated from the above description, an inductor integrated chip and a fabrication method thereof to be electrically connected to an inductor through a connecting electrode formed on a packaging wafer has been suggested. Accordingly, the resistance value and the parasitic component of the inductor integrated chip can be reduced so that the Q value of the inductor is enhanced. Consequently, the performance of the inductor integrated chip is enhanced. Furthermore, the size of the chip can be reduced, the fabrication process is simplified and the fabrication efficiency is enhanced.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. An inductor integrated chip comprising:
    a wafer;
    an inductor bonded on a surface of the wafer;
    a circuit element formed on the surface of the wafer and coupled to a first end of the inductor;
    a packaging wafer connected to the surface of the wafer and packaging the inductor and the circuit element, wherein the packaging wafer comprises a protruding part which extends towards the wafer to form a first cavity and a second cavity, the inductor is disposed in the first cavity and the second cavity, and the circuit element is disposed the second cavity; and
    a connecting electrode formed on the packaging wafer and coupled to a second end of the inductor,
    wherein the connecting electrode comprises a surface connecting electrode formed on a lower surface of the packaging wafer and coupled to the second end of the inductor, and a penetrating connecting electrode penetrating the package wafer and coupled to the surface connecting electrode; and
    wherein the surface connecting electrode is coupled to the second end of the inductor at a bottom surface of the protruding part, and is connected to the penetrating connecting electrode inside the second cavity.

2. The inductor integrated chip of claim 1, wherein the penetrating connecting electrode vertically penetrates through the package wafer.

3. The inductor integrated chip of claim 1, wherein the inductor is formed on the surface of the wafer in a spiral form, an outer end of the inductor being coupled to the circuit element, and an inner end of the inductor being coupled to the surface connecting electrode.

4. The inductor integrated chip of claim 1, wherein the inductor is formed on the surface of the wafer in a meander form, a first end of the inductor being coupled to the circuit element, and a second end of the inductor being coupled to the surface connecting electrode.

5. The inductor integrated chip of claim 1, further comprising an insulation layer bonded on the one surface of the wafer and insulating the circuit element and the inductor from the wafer.

6. The inductor integrated chip of claim 5, wherein the circuit element is a film bulk acoustic resonator (FBAR), the FBAR comprising a lower electrode bonded on the insulation layer, a piezoelectric layer bonded on the lower electrode, an upper electrode bonded on the piezoelectric layer, and an air gap formed between a part of the lower electrode and the insulation layer so as to isolate the lower electrode from the insulation layer.

* * * * *